(12) United States Patent
Kim et al.

(10) Patent No.: US 10,515,589 B2
(45) Date of Patent: Dec. 24, 2019

(54) ORGANIC LIGHT EMITTING DIODE DISPLAY DEVICE AND DRIVING METHOD THEREOF

(71) Applicant: LG Display Co., Ltd., Seoul (KR)

(72) Inventors: Hyuckjun Kim, Goyang-si (KR); Seokhyun Hong, Suwon-si (KR); Myunggi Lim, Ansan-si (KR)

(73) Assignee: LG Display Co., Ltd., Seoul (KR)

( * ) Notice: Subject to any disclaimer, the term of this patent is extended or adjusted under 35 U.S.C. 154(b) by 125 days.

(21) Appl. No.: 15/685,377

(22) Filed: Aug. 24, 2017

(65) Prior Publication Data

US 2018/0061320 A1    Mar. 1, 2018

(30) Foreign Application Priority Data

Aug. 30, 2016  (KR) .................. 10-2016-0110704

(51) Int. Cl.
*G09G 3/3241* (2016.01)
*G09G 3/3291* (2016.01)
*H01L 51/50* (2006.01)
*H05B 33/08* (2006.01)
*G09G 3/3233* (2016.01)

(52) U.S. Cl.
CPC ......... *G09G 3/3241* (2013.01); *G09G 3/3233* (2013.01); *G09G 3/3291* (2013.01); *H01L 51/50* (2013.01); *H05B 33/0896* (2013.01); *G09G 2300/0452* (2013.01); *G09G 2320/0295* (2013.01); *G09G 2320/043* (2013.01); *G09G 2320/045* (2013.01); *G09G 2320/0693* (2013.01)

(58) Field of Classification Search
CPC ... G09G 2320/0295; G09G 2300/0452; G09G 2320/045; G09G 3/3208; G09G 3/2074; G09G 2320/043; G09G 3/3291; G09G 2300/0819; H01L 51/50; H05B 33/0896
See application file for complete search history.

(56) References Cited

U.S. PATENT DOCUMENTS

2006/0187154 A1    8/2006  Tsuchida
2006/0221092 A1    10/2006 Noguchi et al.
(Continued)

OTHER PUBLICATIONS

Extended European Search Report dated May 7, 2018, issued in corresponding European Patent Application No. 17187971.1.
(Continued)

*Primary Examiner* — Patrick N Edouard
*Assistant Examiner* — Douglas M Wilson
(74) *Attorney, Agent, or Firm* — Morgan, Lewis & Bockius LLP

(57) ABSTRACT

The present invention provides an OLED display device including a display panel, a data driver and a timing controller. The display panel has sub-pixels for displaying images. The data driver supplies a data signal to data lines of the sub-pixels. The timing controller supplies the data signal to the data driver and controls the data driver. The data driver outputs a stress prevention voltage for preventing application of stress to driving transistors included in the sub-pixels in response to a stress compensation signal output from the timing controller, and the stress prevention voltage is applied to M (M being an integer equal to or greater than 1) sub-pixels selected per frame.

14 Claims, 13 Drawing Sheets

(56) References Cited

U.S. PATENT DOCUMENTS

2009/0295422 A1    12/2009  Hamer et al.
2011/0164071 A1*   7/2011   Chung ................. G09G 3/3208
                                                        345/690
2016/0027382 A1*   1/2016   Chaji .................... G09G 3/006
                                                        345/212
2017/0124954 A1*   5/2017   Park .................... G09G 3/3258
2017/0162101 A1*   6/2017   Ohara ................. G09G 3/3233

OTHER PUBLICATIONS

Partial European Search Report dated Dec. 14, 2017, issued in corresponding European Patent Application No. 17187971.1.

* cited by examiner

ORGANIC LIGHT EMITTING DIODE DISPLAY DEVICE AND DRIVING METHOD THEREOF

This application claims the benefit of Korean Patent Application No. 10-2016-0110704, filed on Aug. 30, 2016, which is incorporated herein by reference for all purposes as if fully set forth herein.

BACKGROUND

Technical Field

The present invention relates to an organic light emitting diode (OLED) display device and a driving method thereof.

Description of the Related Art

With the development of information technology, the market for display devices, which are media between users and information is growing. Accordingly, display devices such as an organic light emitting diode (OLED) display, a liquid crystal display (LCD) and a plasma display panel (PDP) are increasingly used.

Among the aforementioned displays, the OLED display device includes a display panel including a plurality of sub-pixels and a driver for driving the display panel. The driver includes a scan driver which supplies scan signals (or gate signals) to the display panel and a data driver which supplies data signals to the display panel.

The OLED display device can display images in such a manner that scan signals and data signals are supplied to sub-pixels arranged in a matrix and thus selected sub-pixels emit light.

When the OLED display device is used for a long time, characteristics (threshold voltages, current mobility, etc.) of elements included in sub-pixels change. To solve this problem, a related art OLED display device includes a sensing circuit for sensing characteristics of elements included in sub-pixels. However, the related art OLED display device causes a picture quality problem due to a compensation operation of the sensing circuit. Accordingly, it is necessary to improve the picture quality of OLED display devices.

SUMMARY

Accordingly, embodiments of the present disclosure are directed to an OLED display device and a driving method thereof that substantially obviate one or more of the problems due to limitations and disadvantages of the related art.

An aspect of the present disclosure is to provide an OLED display device with improved picture quality.

Another aspect of the present disclosure is to provide an OLED display device that can be efficiently manufactured.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an OLED display device comprises a display panel, a data driver and a timing controller. The display panel has sub-pixels for displaying images. The data driver supplies a data signal to data lines of the sub-pixels. The timing controller supplies the data signal to the data driver and controls the data driver. The data driver outputs a stress prevention voltage for preventing application of stress to driving transistors included in the sub-pixels in response to a stress compensation signal output from the timing controller, and the stress prevention voltage is applied to M (M being an integer equal to or greater than 1) sub-pixels selected per frame.

In another aspect, a method of driving an OLED display device comprises supplying a black voltage to driving transistors included in all sub-pixels of a display panel; and outputting a stress prevention voltage for preventing a stress of the driving transistors included in the sub-pixels of the display panel. The stress prevention voltage is applied to a driving transistor, included in at least one sub-pixel of first to N-th groups (N being an integer equal to or greater than 4) composed of sub-pixels, for each frame.

It is to be understood that both the foregoing general description and the following detailed description are exemplary and explanatory and are intended to provide further explanation of the inventive concepts as claimed.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Reference will now be made in detail to embodiments of the invention examples of which are illustrated in the accompanying drawings.

Embodiments of the present invention will be described with reference to the attached drawings.

An OLED display device according to the present invention is implemented as a television, a video player, a personal computer (PC), a home theater system, a smartphone, etc. The OLED display device which will be described below performs an image display operation and an external compensation operation.

The external compensation operation may be performed in a vertical blank period during the image display operation, in a power-on sequence period before image display or in a power-off sequence period after image display. The vertical blank period is a period in which data signals for displaying an image are not written and is arranged between vertical active periods in which data signals corresponding to one frame are written.

The power-on sequence period refers to a period from when power for driving the device is turned on to when an image is displayed. The power-off sequence period refers to a period from when image display ends to when the power for driving the device is turned off.

An external compensation method for performing the external compensation operation operates a driving transistor in a source follower mode and then senses a voltage (the source voltage of the driving TFT) stored in a line capacitor (parasitic capacitor) of a sensing line.

The external compensation method senses the source voltage of the driving transistor when the potential of the source node of the driving transistor is saturated (i.e., the current Ids of the driving TFT becomes zero) in order to compensate for threshold voltage deviation of the driving transistor. In addition, the external compensation method senses a value of the source node of the driving transistor in a linear state before the source node reaches a saturation state in order to compensate for mobility deviation of the driving transistor.

Electrodes of a thin film transistor described below exclusive of a gate electrode may be called a source electrode and a drain electrode or a drain electrode and a source electrode according to type. However, they will be described as a first electrode and a second electrode in order not to limit the same.

Figure 1:
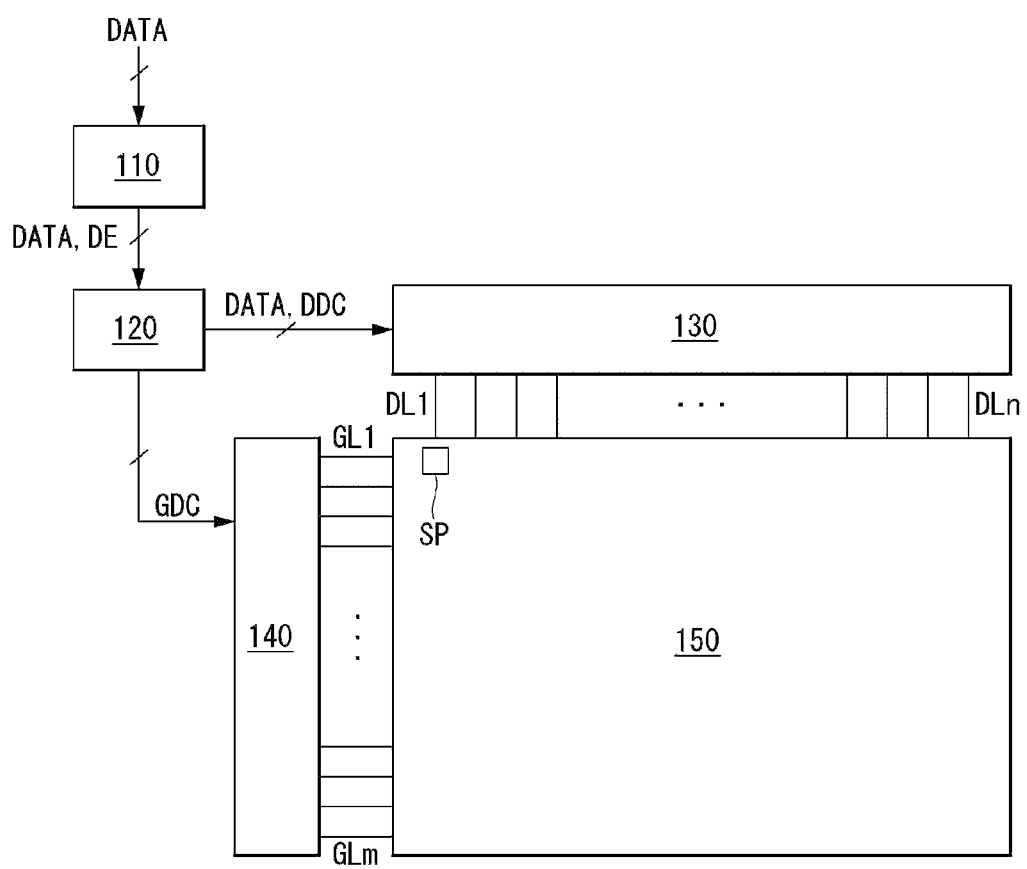
FIG. 1 is a block diagram of an OLED display device.
Figure 2:
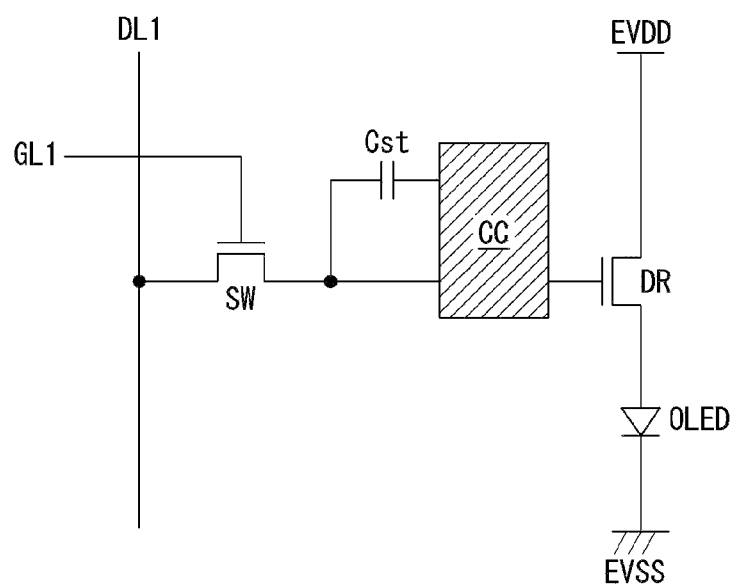
FIG. 2 illustrates a circuit configuration of a sub-pixel.
Figure 3:
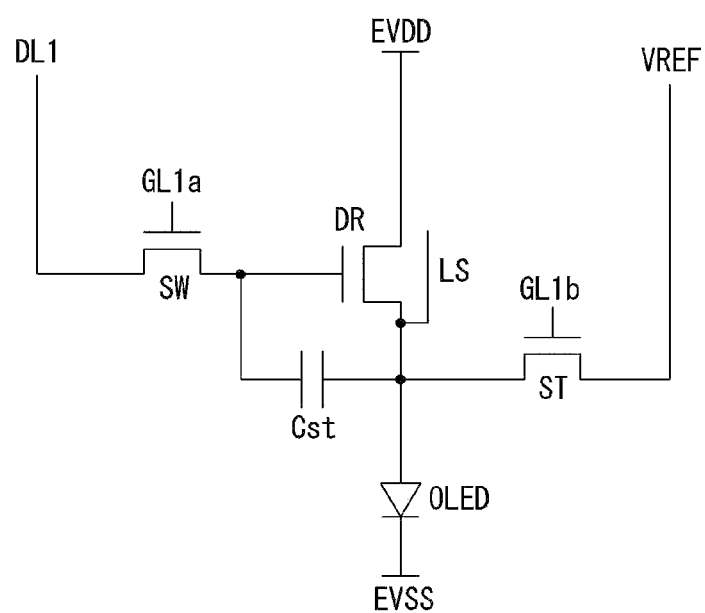
FIG. 3 illustrates the circuit configuration of the sub-pixel in detail.
Figure 4:
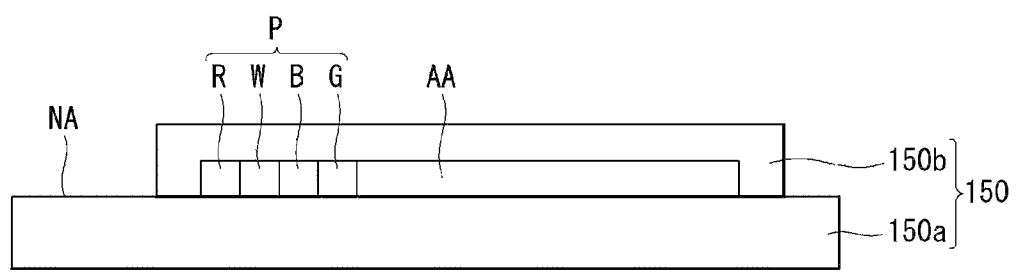
FIG. 4 is a cross-sectional view of a display panel.
Figure 5:
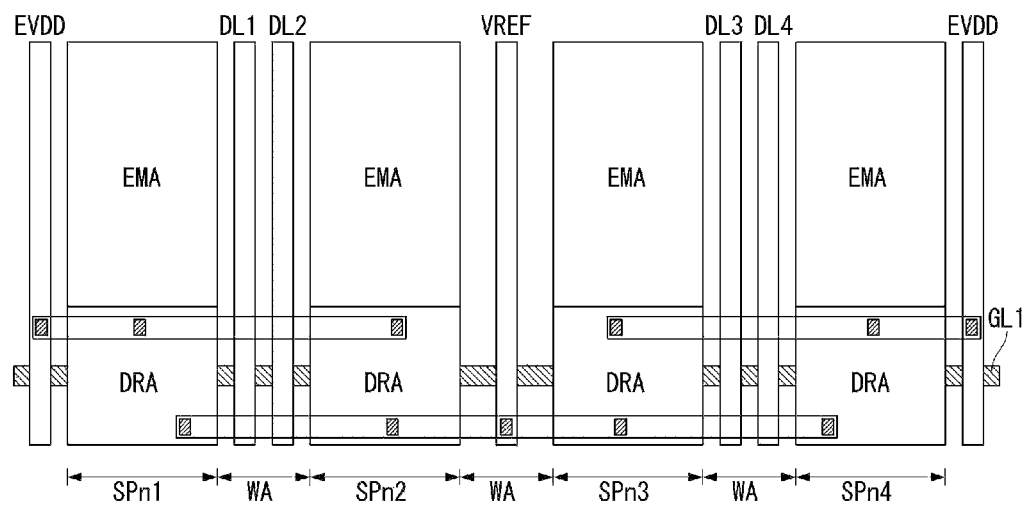
FIG. 5 is a plan view of sub-pixels.
Figure 6:
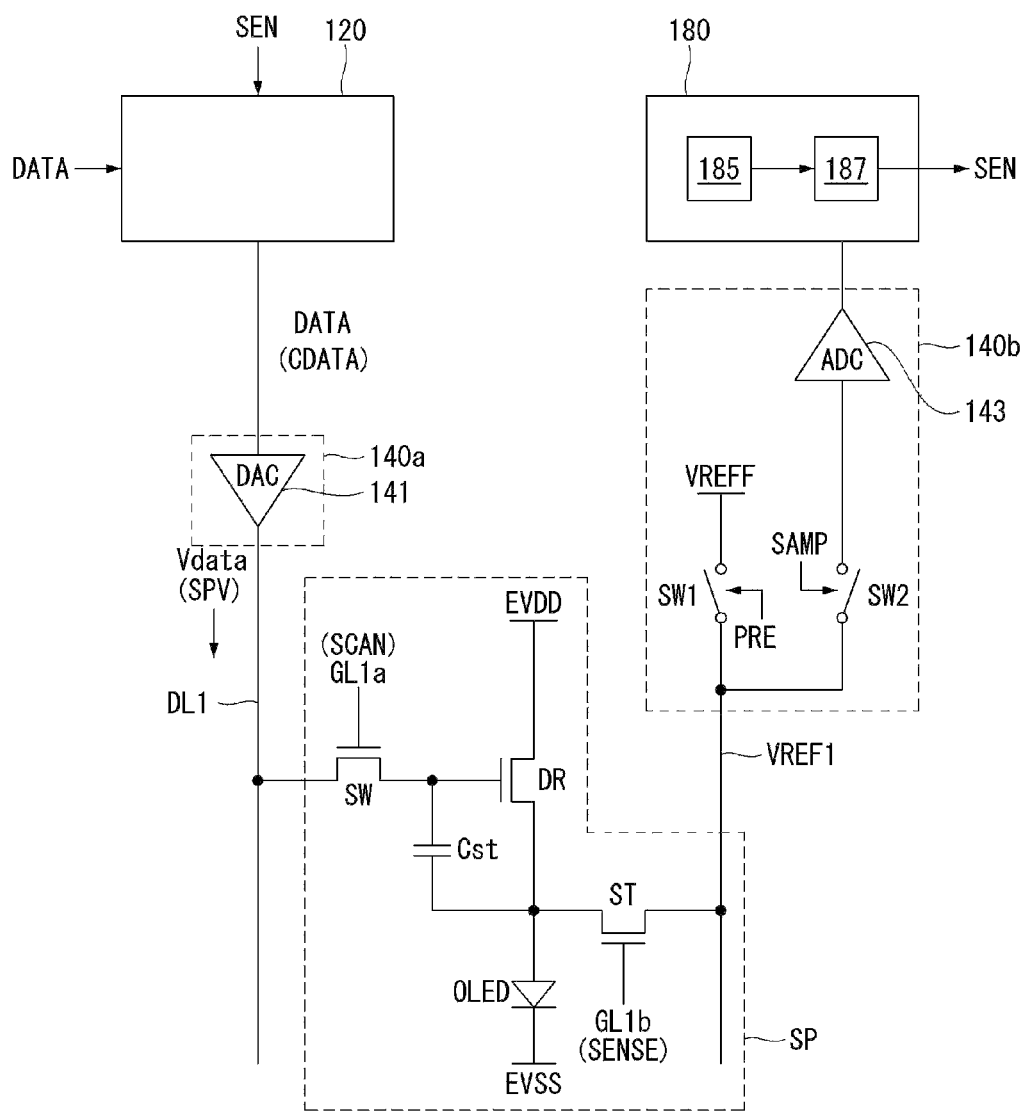
FIG. 6 is a block diagram of an external compensation circuit according to an embodiment of the present invention.
Figure 7:
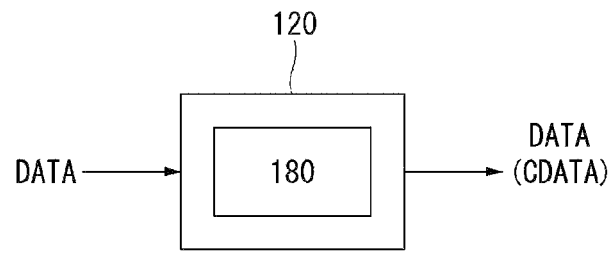
FIG. 7 is a block diagram of a timing controller having a data compensation unit.

FIG. 1 is a block diagram of an OLED display device according to an embodiment of the present invention, FIG. 2 illustrates a circuit configuration of a sub-pixel, and FIG. 3 illustrates a circuit configuration of a sub-pixel in detail. FIG. 4 is a cross-sectional view of a display panel, FIG. 5 is a plan view illustrating sub-pixels, FIG. 6 is a block diagram of an external compensation circuit according to an embodiment of the present invention, and FIG. 7 is a block diagram of a timing controller including a data compensator.

As shown in FIG. 1, the OLED display device includes an image processor 110, a timing controller 120, a data driver 130, a scan driver 140 and a display panel 150.

The image processor 110 outputs a data enable signal DE along with a data signal DATA supplied from the outside. While the image processor 110 can output one or more of a vertical synchronization signal, a horizontal synchronization signal and a clock signal in addition to the data enable signal DE, these signals are not shown for convenience of description.

The timing controller 120 receives the data signal DATA in addition to the data enable signal DE or a driving signal including the vertical synchronization signal, the horizontal synchronization signal and the clock signal from the image processor 110. The timing controller 120 outputs a gate timing control signal GDC for controlling operation timing of the scan driver 140 and a data timing control signal DDC for controlling operation timing of the data driver 130 on the basis of the driving signal.

The data driver 130 samples and latches the data signal DATA supplied from the timing controller 120 in response to the data timing control signal DDC received from the timing controller 120 to convert the data signal DATA into a gamma reference voltage and outputs the gamma reference voltage. The data driver 130 outputs the data signal DATA through data lines DL1 to DLn. The data driver 130 may take the form of an integrated circuit (IC).

The scan driver 140 outputs a scan signal in response to the gate timing control signal GDC supplied from the timing controller 120. The scan driver 140 outputs the scan signal through scan lines GL1 to GLm. The scan driver 140 takes the form of an IC or the form of a gate-in-panel in the display panel 150.

The display panel 150 displays an image in response to the data signal DATA and the scan signal supplied from the data driver 130 and the scan driver 140. The display panel 150 includes sub-pixels SP operating to display an image.

The sub-pixels SP include red, green and blue sub-pixels or white, red, green and blue sub-pixels. The sub-pixels SP may have one or more different emission areas according to emission characteristics.

As shown in FIG. 2, a single sub-pixel includes a switching transistor SW, a driving transistor DR, a capacitor Cst, a compensation circuit CC and an OLED.

The switching transistor SW performs a switching operation such that a data signal supplied through the first data line DL1 is stored in the capacitor Cst as a data voltage in response to a scan signal supplied through the first scan line GL1. The driving transistor DR operates such that a driving current flows between a first power line EVDD and a second power line EVSS according to the data voltage stored in the capacitor Cst. The OLED operates to emit light according to the driving current generated by the driving transistor DR.

The compensation circuit CC is added to the sub-pixel in order to compensate for a threshold voltage of the driving transistor DR. The compensation circuit CC is composed of one or more transistors. The compensation circuit CC is configured in various manners depending on compensation methods. An example of the configuration of the compensation circuit CC will be described below.

As shown in FIG. 3, the compensation circuit CC includes a sensing transistor ST and a sensing line VREF (or a reference line). The sensing transistor ST is connected between the source line of the driving transistor DR and the anode of the OLED (to a sensing node). The sensing transistor ST operates to supply an initialization voltage (or sensing voltage) delivered through the sensing line VREF to the source node (or sensing node) of the driving transistor DR or to sense the voltage or current of the source node of the driving transistor DR.

The switching transistor SW has a first electrode connected to the first data line DL1 and a second electrode connected to the gate electrode of the driving transistor DR. The driving transistor DR has a first electrode connected to the first power line EVDD and a second electrode connected to the anode of the OLED. The capacitor Cst has a first electrode connected to the gate electrode of the driving transistor DR and a second electrode connected to the anode of the OLED. The OLED has the anode connected to the second electrode of the driving transistor DR and a cathode connected to the second power line EVSS. The sensing transistor ST has a first electrode connected to the sensing line VREF and a second electrode connected to the anode of the OLED.

The operating time of the sensing transistor ST may be similar/identical to the operating time of the switching transistor SW according to an external compensation algorithm (or the configuration of the compensation circuit). For example, the gate electrode of the switching transistor SW can be connected to a first a scan line GL1a and the gate electrode of the sensing transistor ST can be connected to a first b sensing line GL1b. Alternatively, the first a scan line GL1a connected to the gate electrode of the switching transistor SW and the first b scan line GL1b connected to the gate electrode of the sensing transistor ST may be connected to be shared.

The sensing line VREF may be connected to the data driver. In this case, the data driver can sense the sensing node of the sub-pixel in real time, for an image non-display period or for a period of N frames (N being an integer equal to or greater than 1) and generate a sensing result. Meanwhile, the switching transistor SW and the sensing transistor ST may be turned on at the same time. In this case, a sensing operation through the sensing line VREF and a data output operation for outputting a data signal are separated from each other on the basis of a time division method of the data driver.

In addition, a compensation target according to the sensing result may be a digital data signal, an analog data signal or a gamma signal. Furthermore, the compensation circuit which generates a compensation signal (or compensation voltage) on the basis of the sensing result may be included in the data driver or the timing controller, or implemented as a separate circuit.

A light shielding layer LS may be formed only under the channel region of the driving transistor DR or formed under the channel regions of the switching transistor SW and the sensing transistor ST as well as the channel region of the driving transistor DR. The light shielding layer LS may be used to simply block external light or may be used as an electrode which is connected to other electrodes or lines and constitutes a capacitor.

Although FIG. 3 shows that a sub-pixel having a 3T (Transistor) 1C (Capacitor) structure which includes the switching transistor SW, the driving transistor DR, the capacitor Cst, the OLED and the sensing transistor ST, a sub-pixel may be configured in 3T2C, 4T2C, 5T1C and 6T2C structures when the compensation circuit CC is added.

As shown in FIG. 4, sub-pixels are formed on a display area AA of a first substrate (or TFT substrate) 150a on the basis of the circuit described with reference to FIG. 3. The sub-pixels formed on the display area AA are sealed by a passivation film (or passivation substrate) 150b. NA indicates a non-display area. The first substrate 150a can be formed of glass or a ductile material.

The sub-pixels are horizontally or vertically arranged in the order of red (R), white (W), blue (B) and green (G) sub-pixels on the display area AA. Sub-pixels R, W, B and G constitute a single pixel P. However, the arrangement order of the sub-pixels may be changed in various manners according to emission materials, emission areas, compensation circuit configurations (structures), etc. Furthermore, sub-pixels R, B and G may constitute a single pixel P.

As shown in FIGS. 4 and 5, first to fourth sub-pixels SPn1 to SPn4 each having an emission area EMA and a circuit area DRA are formed on the display area AA of the first substrate 150a. An OLED is formed in the emission area EMA and TFTs including switching and driving transistors are formed in the circuit area DRA. The elements formed in the emission area EMA and the circuit area DRA are obtained through processes of depositing a plurality of metal layers and insulating layers.

In the first to fourth sub-pixels SPn1 to SPn4, the OLED positioned in the emission area EMA emits light in response to operations of the switching and driving transistors positioned in the circuit area DRA. "WA" between neighboring sub-pixels of the first to fourth sub-pixels SPn1 to SPn4 indicates a line area in which power lines or data lines are arranged.

The first power line EVDD may be positioned at the left of the first sub-pixel SPn1, the sensing line VREF may be positioned at the right of the second sub-pixel SPn2, and the first and second data lines DL1 and DL2 may be positioned between the first sub-pixel SPn1 and the second sub-pixel SPn2.

The sensing line VREF may be positioned at the left of the third sub-pixel SPn3, the first power line EVDD may be positioned at the right of the fourth sub-pixel SPn4, and the third and fourth data lines DL3 and DL4 may be positioned between the third sub-pixel SPn3 and the fourth sub-pixel SPn4.

The first sub-pixel SPn1 can be electrically connected to the first power line EVDD located at the left thereof, the first data line DL1 located at the right thereof, and the sensing line VREF located at the right of the second sub-pixel SPn2. The second sub-pixel SPn2 can be electrically connected to the second data line DL2 located at the left thereof, the sensing line VREF located at the right thereof, and the first power line EVDD located at the left of the first sub-pixel SPn1.

The third sub-pixel SPn3 can be electrically connected to the sensing line VREF located at the left thereof, the third data line DL3 located at the right thereof, and the first power line EVDD located at the right of the fourth sub-pixel SPn4. The fourth sub-pixel SPn4 can be electrically connected to the fourth data line DL4 located at the left thereof, the first power line EVDD located at the right thereof, and the sensing line VREF located at the left of the third sub-pixel SPn3.

Although the first to fourth sub-pixels SPn1 to SPn4 may be commonly connected to the sensing line VREF positioned between the second sub-pixel SPn2 and the third sub-pixel SPn3, the present invention is not limited thereto. In addition, although only one scan line GL1 is shown, the present invention is not limited thereto.

In addition, although lines such as the first power line EVDD and the sensing line VREF and electrodes constituting the TFTs are located on different layers, they are electrically connected through contact holes (via holes). A contact hole is formed through a dry or wet etching process to expose part of an electrode, a signal line or a power line positioned therebeneath.

As shown in FIG. 6, the data driver 140 includes a first circuit unit 140a which outputs data signals to sub-pixels SP and a second circuit unit 140b which senses sub-pixels SP in order to compensate for data signals.

The first circuit unit 140a includes a digital-to-analog conversion circuit 141 which converts a digital data signal into an analog data signal Vdata and outputs the analog data signal. The output terminal of the first circuit 140*a* is connected to the first data line DL1.

The second circuit unit 140*b* includes a voltage output circuit SW1, a sampling circuit SW2 and an analog-to-digital conversion circuit 143. The voltage output circuit SW1 operates in response to a charge control signal PRE. The sampling circuit SW2 operates in response to a sampling control signal SAMP.

The voltage output circuit SW1 outputs a first initialization voltage generated from a voltage source VREFF to the first sensing line VREF1 and outputs a second initialization voltage generated from the voltage source VREFF through the first data line DL1. The first initialization voltage and the second initialization voltage generated from the voltage source VREFF are generated as voltages between a first potential voltage and a second potential voltage.

The first initialization voltage and the second initialization voltage can be set to similar voltages or identical voltages. The first initialization voltage can be set to a voltage similar to the ground level to be used for external compensation of the display panel and the second initialization voltage can be set to be higher than the initialization voltage to be used for normal operation of the display panel. The voltage output circuit SW1 only operates when it outputs the first initialization voltage and the second initialization voltage. While only the switch SW1 and the voltage source VREFF are shown as components of the voltage output circuit SW1, the configuration of the voltage output circuit SW1 is not limited thereto.

The sampling circuit SW2 senses sub-pixels SP through the first sensing line VREF1. The sampling circuit SW2 senses the threshold voltage of the OLED and the threshold voltage or mobility of the driving transistor DR through sampling and then delivers sensing values to the analog-to-digital conversion circuit 143. While the sampling circuit SW2 is shown in the form of a switch SW2, the configuration of the sampling circuit SW2 is not limited thereto and the sampling circuit SW2 may be realized by an active element and a passive element.

The analog-to-digital conversion circuit 143 receives the sensing values from the sampling circuit SW2 and converts analog voltage values into digital voltage values. The analog-to-digital conversion circuit 143 outputs the sensing values converted into digital values. The sensing values output from the analog-to-digital conversion circuit 143 are applied to a compensation driver 180.

The compensation driver 180 performs a compensation process necessary for external compensation on the basis of the digital sensing values delivered from the second circuit unit 140*b* of the data driver 140*a* and 140*b*.

The compensation driver 180 generates a compensation value necessary for external compensation, or corrects or controls the compensation value on the basis of the sensing values. The compensation driver 180 includes a determination unit 185 and a compensation value generator 187.

The determination unit 185 determines whether to perform external compensation or which sub-pixels require external compensation on the basis of the sensing values. The compensation value generator 187 generates a compensation value SEN in response to information delivered from the determination unit 185. The compensation value generator 187 provides the compensation value SEN to the timing controller 120.

The timing controller 120 compensates for data signals on the basis of the compensation value SEN supplied from the compensation value generator 187. The timing controller 120 outputs a compensation data signal DATA or a data signal DATA depending on whether compensation will be performed.

The timing controller 120 outputs a black data signal in order to realize real black on the display panel in addition to external compensation. The data driver 140*a* and 140*b* applies a black voltage Black Vgs to the gate and source electrodes of the driving transistor. The black voltage may correspond to the ground level or may be set to a voltage close to the ground level. The black voltage Black Vgs is supplied to all sub-pixels of the display panel.

In addition, the timing controller 120 outputs a stress compensation signal for compensating for a stress of the driving transistor DR. When a negative voltage such as the black voltage is continuously applied to the driving transistor DR included in each sub-pixel, the threshold voltage of the driving transistor DR is shifted in the negative direction. To prevent NBTIS (Negative Bias Thermal Illumination Stress) of the driving transistor DR, the data driver 140*a* and 140*b* needs to output a positive voltage at a specific level.

The data driver 140*a* and 140*b* outputs a stress prevention voltage SPV for preventing and improving (reducing) NBTIS of the driving transistor DR in response to the stress compensation signal output from the timing controller 120. The stress prevention voltage SPV is delivered through data lines and supplied to the driving transistor DR included in each sub-pixel.

The switching transistor SW is turned on in response to a scan signal SCAN supplied through the first-a scan line GL1*a* and the sensing transistor ST is turned on in response to a sensing signal SENSE supplied through the first-b scan line GL1*b*. The scan signal SCAN and the sensing signal SENSE may have different driving timings depending on driving methods. This does not correspond to the features of the present invention and thus description thereof is omitted. However, the switching transistor SW needs to be turned on in order to supply the stress prevention voltage SPV to the driving transistor DR.

As shown in FIGS. 6 and 7, the compensation driver 180 may be included in the timing controller 120. In this case, the second circuit unit 140*b* of the data driver 140*a* and 140*b* delivers sensing values to the timing controller 120.

Experimental Example

Figure 8:
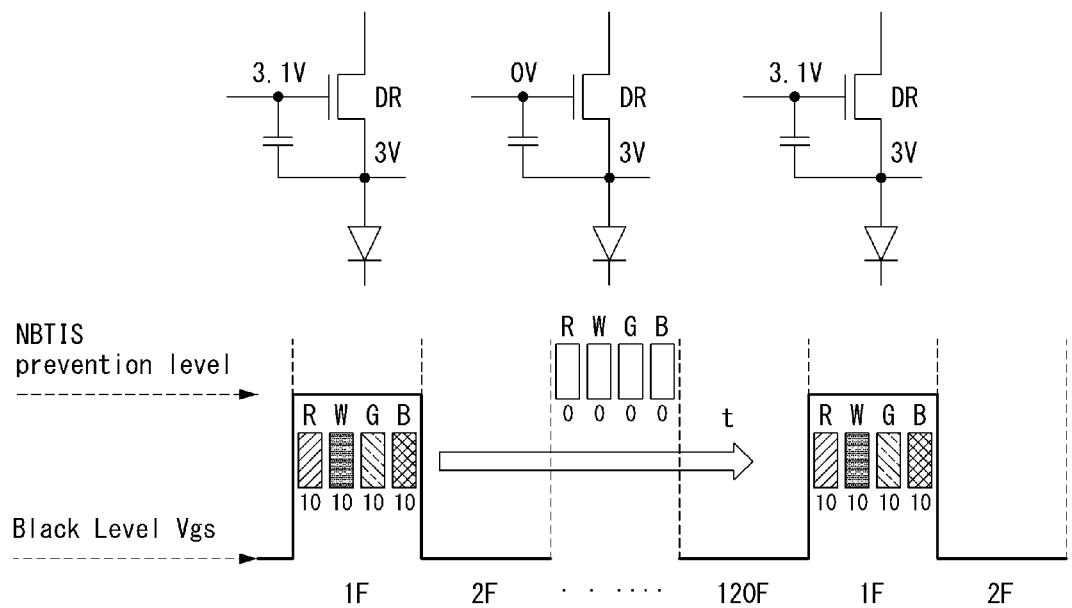
FIG. 8 is a waveform diagram for describing a method of preventing stress of a driving transistor according to an experimental example.
Figure 9:
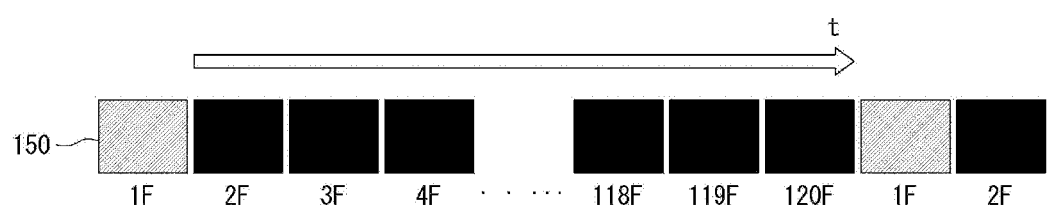
FIG. 9 is a diagram for describing problems of the experimental example.

FIG. 8 is a waveform diagram for describing a method of preventing application of stress to a driving transistor according to an experimental example and FIG. 9 is a diagram for describing problems of the experimental example.

As shown in FIGS. 8 and 9, in the experimental example, a stress prevention voltage is applied to the gate electrode and the source electrode of the driving transistors DR included in each sub-pixel of the display panel in a specific period (e.g., 120F, F indicating a frame). The stress prevention voltage is set to a positive voltage (e.g., 3.1V) which can prevent and improve (reduce) NBTIS of the driving transistor DR.

When a stress prevention voltage is applied to the gate and source electrodes of the driving transistors DR included in all sub-pixels of the display panel as in the experimental example, a problem that a smear in an indeterminate form is generated on the display panel due to a threshold value shift of the driving transistors DR is solved. However, in the experimental example, periodic (every 120F) flicker of the display panel is recognized when the stress prevention voltage is applied to the driving transistors DR of all sub-pixels in a specific period, as shown in FIG. 9.

Furthermore, the display panel is realized on the basis of red, white, green and blue sub-pixels R, W, G and B and the stress prevention voltage is modulated for the area of the display panel to be applied to the sub-pixels in the experimental example. However, when the stress prevention voltage is modulated for the area of the display panel as in the experimental example, real black is not expressed on the display panel and black floating (similar to black but not real black) is recognized.

Accordingly, although the experimental example can prevent and improve (reduce) NBTIS of the driving transistors and solve the problem of generation of indeterminate smear, flicker and black floating on the display panel are recognized and thus it is necessary to solve this problem.

First Embodiment

Figure 10:
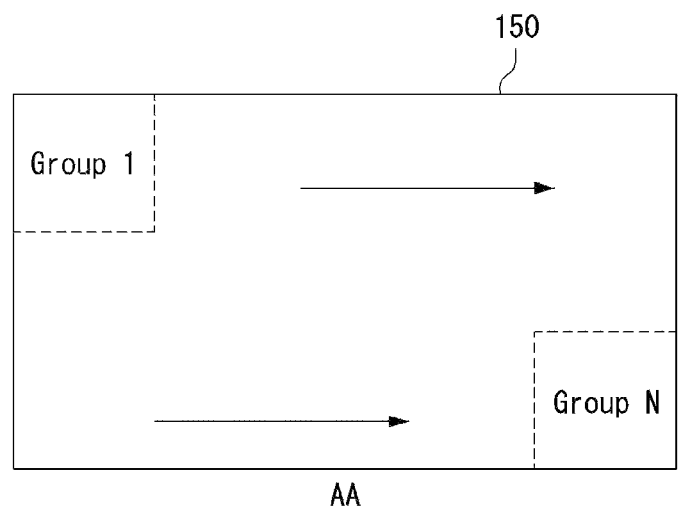
FIG. 10 is a diagram for describing the concept of a first embodiment of the present invention.
Figure 11:
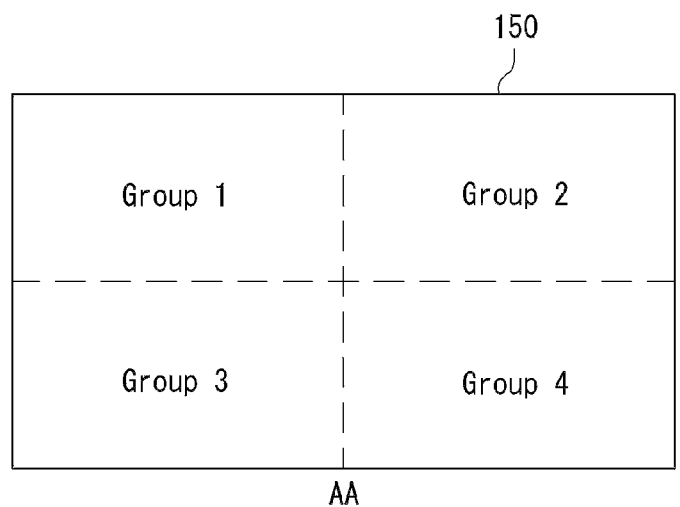
FIG. 11 illustrates an example of dividing a display area of a display panel into four regions in order to describe the first embodiment of the present invention.
Figure 12:
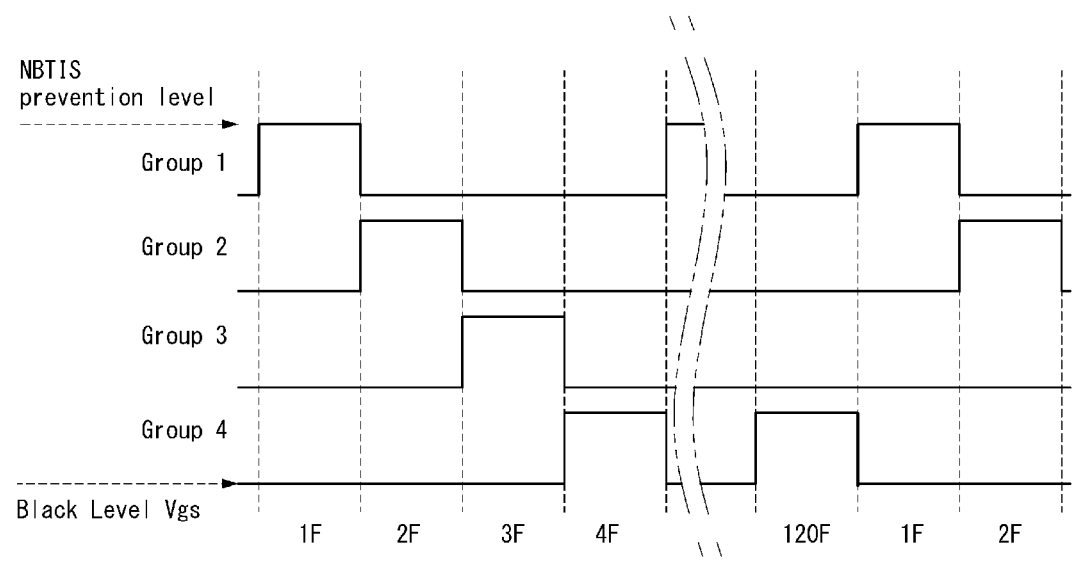
FIG. 12 illustrates waveforms for describing a method of applying a stress prevention voltage of a driving transistor according to the first embodiment of the present invention.
Figure 13:
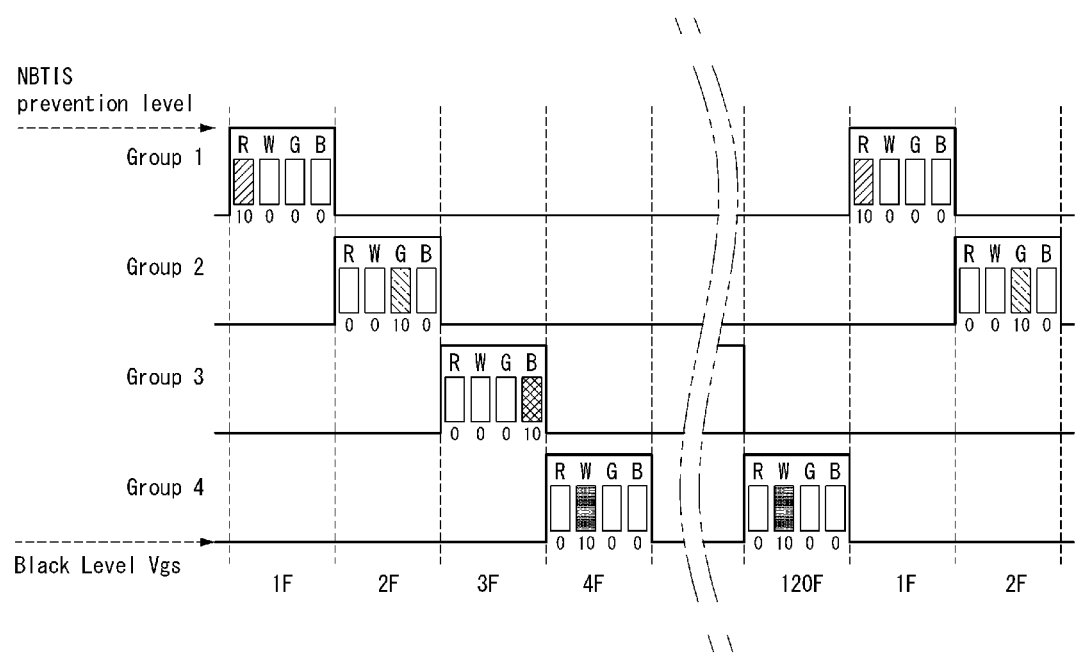
FIG. 13 illustrates waveforms for describing the method of applying the stress prevention voltage of FIG. 12 in more detail.

FIG. 10 is a diagram for describing the concept of a first embodiment of the present invention, FIG. 11 illustrates an example of dividing a display area of a display panel into four regions in order to describe the first embodiment of the present invention, FIG. 12 illustrates waveforms for describing a method of applying a stress prevention voltage of a driving transistor according to the first embodiment of the present invention, and FIG. 13 illustrates waveforms for describing the method of applying the stress prevention voltage of FIG. 12 in more detail.

As shown in FIGS. 10 and 11, in the first embodiment of the present invention, sub-pixel groups are configured in order to solve visibility problems such as flicker and black floating generated in the experimental example. For example, the display panel 150 can be grouped into a first group (Group 1) to an N-th group (Group N) (N being an integer equal to or greater than 4).

One group can be defined as one pixel including a red sub-pixel, a white sub-pixel, a green sub-pixel and a blue sub-pixel. However, the number of pixels which define one group may be changed or set depending on the resolution and driving environment of the display panel.

In the following description, the display area AA of the display panel is divided into four regions and these regions are defined as first to fourth groups Group 1 to Group 4) as shown in FIG. 11 for convenience of description.

As shown in FIGS. 11 and 12, in the first embodiment of the present invention, a group is selected per frame in ascending order of the first to fourth groups Group1 to Group 4, and a stress prevention voltage is applied to the gate and source electrodes of the driving transistor included in at least one sub-pixel of the selected group.

The stress prevention voltage is set to a positive voltage which can prevent and improve (reduce) NBTIS of the driving transistor. A voltage level (NBTIS prevention level) selected as the stress prevention voltage can be higher than a voltage level Black Level Vgs selected as a black voltage.

For example, the stress prevention voltage is applied to the gate and source electrodes of the driving transistors included in the first group Group 1 for the first frame 1F. The stress prevention voltage is applied to the gate and source electrodes of the driving transistors included in the second group Group 2 for the second frame 2F. The stress prevention voltage is applied to the gate and source electrodes of the driving transistors included in the third group Group 3 for the third frame 3F. The stress prevention voltage is applied to the gate and source electrodes of the driving transistors included in the fourth group Group 4 for the fourth frame 4F.

In this manner, a group is selected per frame in ascending order of the first to fourth groups Group1 to Group 4, and the stress prevention voltage is applied to the gate and source electrodes of the driving transistors included in a selected group in the first embodiment of the present invention. Each group is defined as one pixel including a red sub-pixel, a white sub-pixel, a green sub-pixel and a blue sub-pixel. The manner of applying the stress prevention voltage will be described below in more detail.

As shown in FIG. 13, the stress prevention voltage is applied to the driving transistor included in the red sub-pixel R for the first frame 1F for which the first group Group 1 is selected. The stress prevention voltage is applied to the driving transistor included in the green sub-pixel G for the second frame 2F for which the second group Group 2 is selected. The stress prevention voltage is applied to the driving transistor included in the blue sub-pixel B for the third frame 3F for which the third group Group 3 is selected. The stress prevention voltage is applied to the driving transistor included in the white sub-pixel W for the fourth frame 4F for which the fourth group Group 4 is selected.

According to the above description, a group is selected per frame in ascending order, and voltage modulation for applying the stress prevention voltage to the driving transistor included in a specific sub-pixel in the selected group is performed in the first embodiment. Therefore, a compensation region can be reduced compared to the experimental example.

Meanwhile, different stresses may be applied to the driving transistors included in the sub-pixels of the first to fourth groups Group 1 to Group 4. Accordingly, the stress prevention voltage supplied to the driving transistors included in the sub-pixels of the first to fourth groups Group 1 to Group 4 may be varied to different voltages in response to the stresses applied to the driving transistors and supplied to the driving transistors.

FIG. 13 shows an example in which the stress prevention voltage is applied to only one specific sub-pixel per frame. However, since the number of sub-pixels included in one group is not limited to 4, the specific sub-pixel needs to be interpreted as one or more, that is, M (M being an integer greater than 1) sub-pixels.

In addition, FIG. 13 shows an example in which the stress prevention voltage is applied to the driving transistors included in the sub-pixels of the same group selected for the first frame 1F even for the first frame 1F after the 120-th frame 120F has elapsed as the UHD model is exemplified. However, this is merely an example and the stress prevention voltage application target may be changed such that the stress prevention voltage is applied to the driving transistors included in other sub-pixels in the group.

When the compensation region is reduced as in the first embodiment, a compensation range (or target) is reduced to a level that cannot be recognized by a person and the stress prevention voltage is applied to only the reduced range. In other words, the stress prevention voltage is applied in microscopic units which control sub-pixels instead of macroscopic units which control the entire display panel in the first embodiment, it is possible to mitigate or improve flicker and black floating generated in the experimental example. In addition, when the compensation region is reduced as in the first embodiment, a compensation margin of the driving transistor can be secured during external compensation.

Furthermore, the stress prevention voltage is applied to the driving transistors included in all sub-pixels, and thus all the sub-pixels emit light in the experimental example. However, the first embodiment sequentially selects groups per frame and applies the stress prevention voltage to the driving transistor included in a specific sub-pixel in a selected group. Accordingly, the number of emission targets can be reduced to ¼ (4 sub-pixel structure) or ⅓ (3 sub-pixel structure) compared to the experimental example. That is, the first embodiment can solve the visibility problem (reduce the luminance to ¾ compared to the method of the experimental example and change an emission area) in the external compensation operation.

The operation of applying the stress prevention voltage requires a higher frequency as the size of a group decreases and requires a lower frequency as the group size increases. Furthermore, the voltage level (NBTIS prevention level) selected as the stress prevention voltage is related to the voltage level (Black Level Vgs) selected as the black level, and thus this needs to be considered when the frequency as well as the group size are determined.

In addition to the first embodiment of the present invention in which groups are selected in ascending order as described above, methods according to the following embodiments may be used.

Second Embodiment

Figure 14:
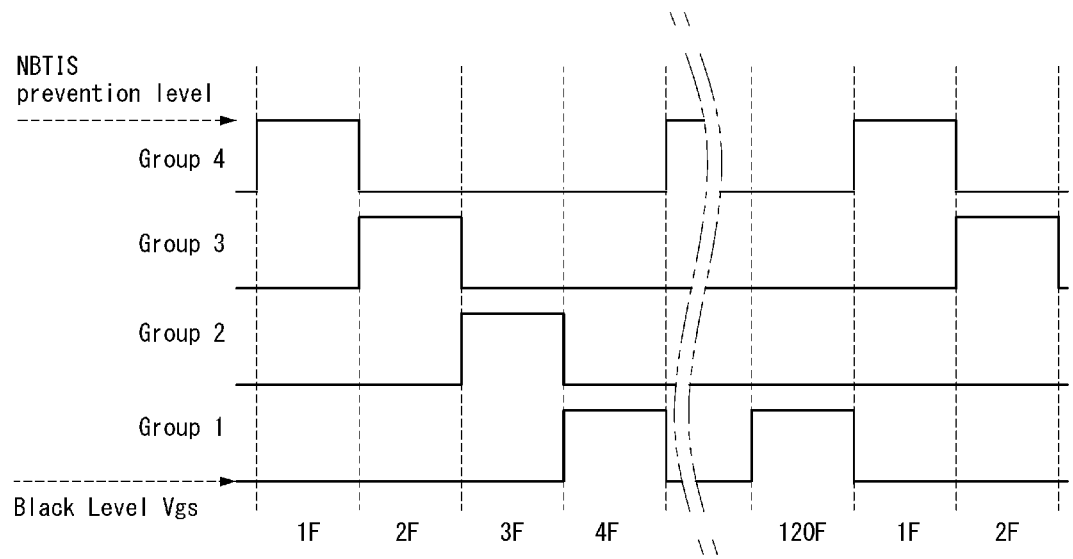
FIG. 14 illustrates waveforms for describing a method of applying a stress prevention voltage of a driving transistor according to a second embodiment of the present invention.
Figure 15:
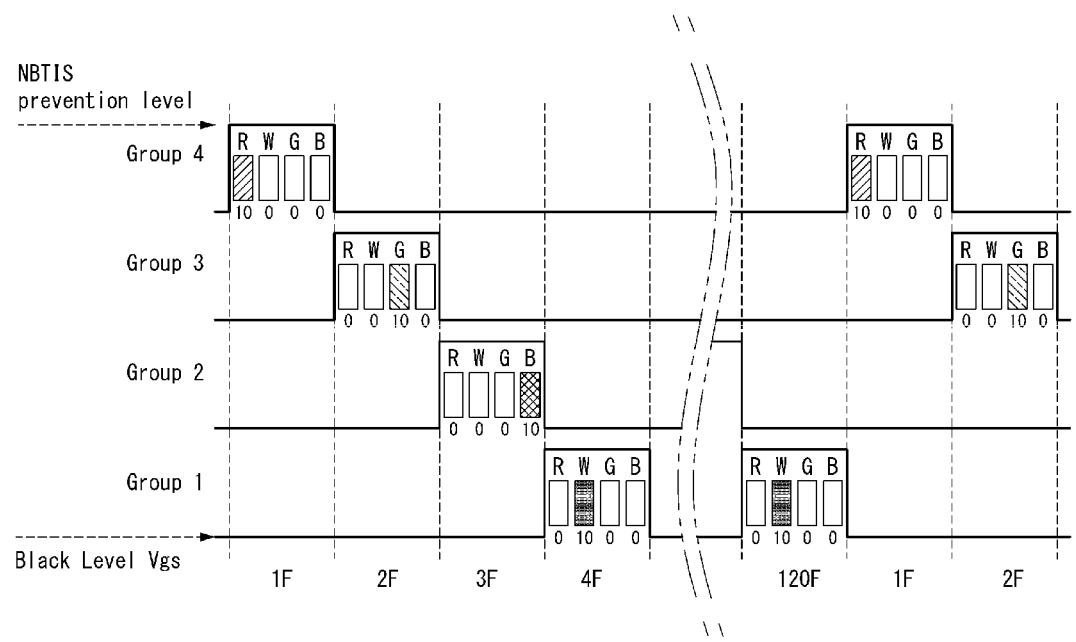
FIG. 15 illustrates waveforms for describing the method of applying the stress prevention voltage of FIG. 14 in more detail.

FIG. 14 illustrates waveforms for describing a method of applying a stress prevention voltage of a driving transistor according to a second embodiment of the present invention, and FIG. 15 illustrates waveforms for describing the method of applying the stress prevention voltage of FIG. 14 in more detail.

As shown in FIGS. 11 and 14, in the second embodiment of the present invention, a group is selected per frame in descending order of the fourth to first groups Group 4 to Group 1, and a stress prevention voltage is applied to the gate and source electrodes of the driving transistor included in at least one sub-pixel of the selected group.

The stress prevention voltage is set to a positive voltage which can prevent and improve (reduce) NBTIS of the driving transistor. A voltage level (NBTIS prevention level) selected as the stress prevention voltage can be higher than a voltage level Black Level Vgs selected as a black voltage.

For example, the stress prevention voltage is applied to the gate and source electrodes of the driving transistors included in the fourth group Group 4 for the first frame 1F. The stress prevention voltage is applied to the gate and source electrodes of the driving transistors included in the third group Group 3 for the second frame 2F. The stress prevention voltage is applied to the gate and source electrodes of the driving transistors included in the second group Group 2 for the third frame 3F. The stress prevention voltage is applied to the gate and source electrodes of the driving transistors included in the first group Group 1 for the fourth frame 4F.

In this manner, a group is selected per frame in descending order of the fourth to first groups Group 4 to Group 1, and the stress prevention voltage is applied to the gate and source electrodes of the driving transistors included in a selected group in the second embodiment of the present invention. Each group is defined as one pixel including a red sub-pixel, a white sub-pixel, a green sub-pixel and a blue sub-pixel. The manner of applying the stress prevention voltage will be described below in more detail.

As shown in FIG. 15, the stress prevention voltage is applied to the driving transistor included in the red sub-pixel R for the first frame 1F for which the fourth group Group 4 is selected. The stress prevention voltage is applied to the driving transistor included in the green sub-pixel G for the second frame 2F for which the third group Group 3 is selected. The stress prevention voltage is applied to the driving transistor included in the blue sub-pixel B for the third frame 3F for which the second group Group 2 is selected. The stress prevention voltage is applied to the driving transistor included in the white sub-pixel W for the fourth frame 4F for which the first group Group 1 is selected.

The stress prevention voltage is applied in microscopic units which control sub-pixels instead of macroscopic units which control the entire display panel in the second embodiment, it is possible to mitigate or improve flicker and black floating generated in the experimental example.

Third Embodiment

Figure 16:
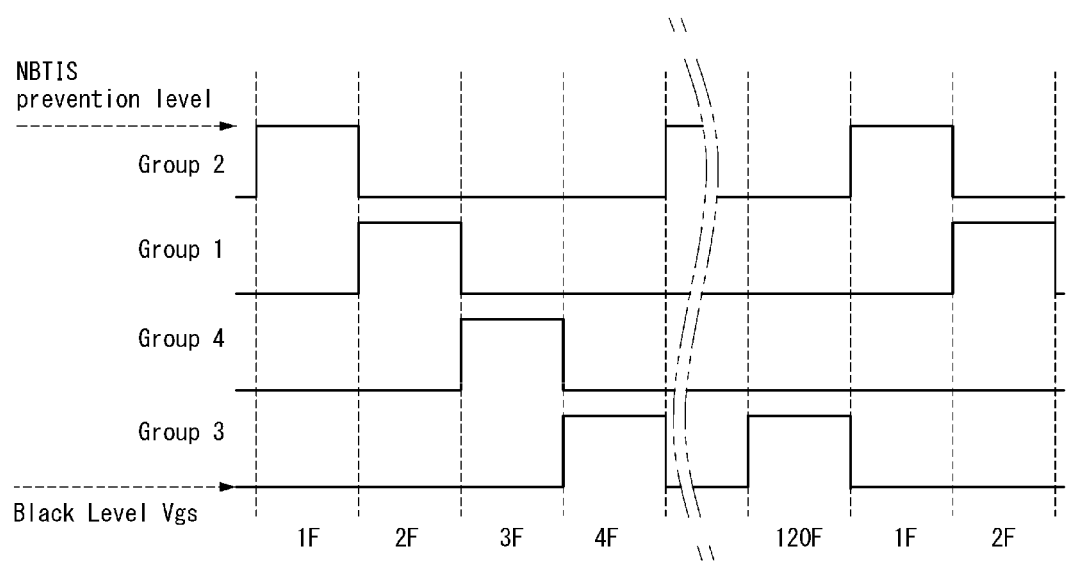
FIG. 16 illustrates waveforms for describing a method of applying a stress prevention voltage of a driving transistor according to a third embodiment of the present invention.

FIG. 16 illustrates waveforms for describing a method of applying a stress prevention voltage of a driving transistor according to a third embodiment of the present invention.

As shown in FIGS. 11 and 16, according to the third embodiment of the present invention, a group is selected per frame in the order of the second, first, fourth and third groups Group 2, Group 1, Group 4 and Group 3 or in a random order and the stress prevention voltage is applied to the gate and source electrodes of the driving transistor included in at least one sub-pixel of a selected group.

The stress prevention voltage is set to a positive voltage which can prevent and improve (reduce) NBTIS of the driving transistor. A voltage level (NBTIS prevention level) selected as the stress prevention voltage can be higher than a voltage level Black Level Vgs selected as a black voltage.

For example, the stress prevention voltage is applied to the gate and source electrodes of the driving transistors included in the second group Group 2 for the first frame 1F. The stress prevention voltage is applied to the gate and source electrodes of the driving transistors included in the first group Group 1 for the second frame 2F. The stress prevention voltage is applied to the gate and source electrodes of the driving transistors included in the fourth group Group 4 for the third frame 3F. The stress prevention voltage is applied to the gate and source electrodes of the driving transistors included in the third group Group 3 for the fourth frame 4F.

In this manner, according to the third embodiment of the present invention, a group is selected per frame in the order of the second, first, fourth and third groups Group 2, Group 1, Group 4 and Group 3 or in a random order and the stress prevention voltage is applied to the gate and source electrodes of the driving transistor included in a selected group.

The stress prevention voltage is applied in microscopic units which control sub-pixels instead of macroscopic units which control the entire display panel in the third embodiment, it is possible to mitigate or improve flicker and black floating generated in the experimental example.

The present invention may determine whether to apply the stress prevention voltage depending on an image analysis result in order to realize high picture quality of the OLED display device. This will be described below.

Fourth Embodiment

Figure 17:
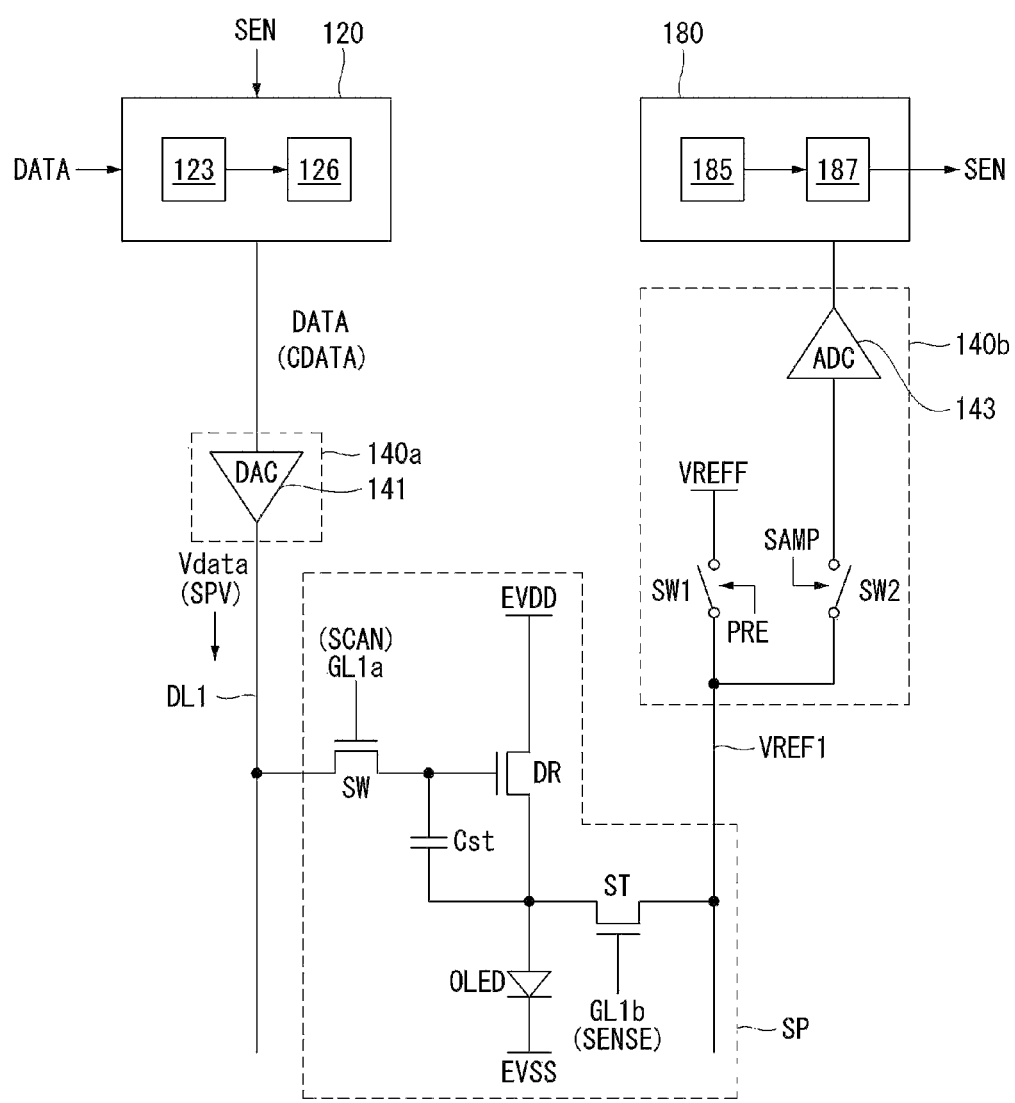
FIG. 17 is a block diagram of an external compensation circuit according to a fourth embodiment of the present invention.
Figure 18:
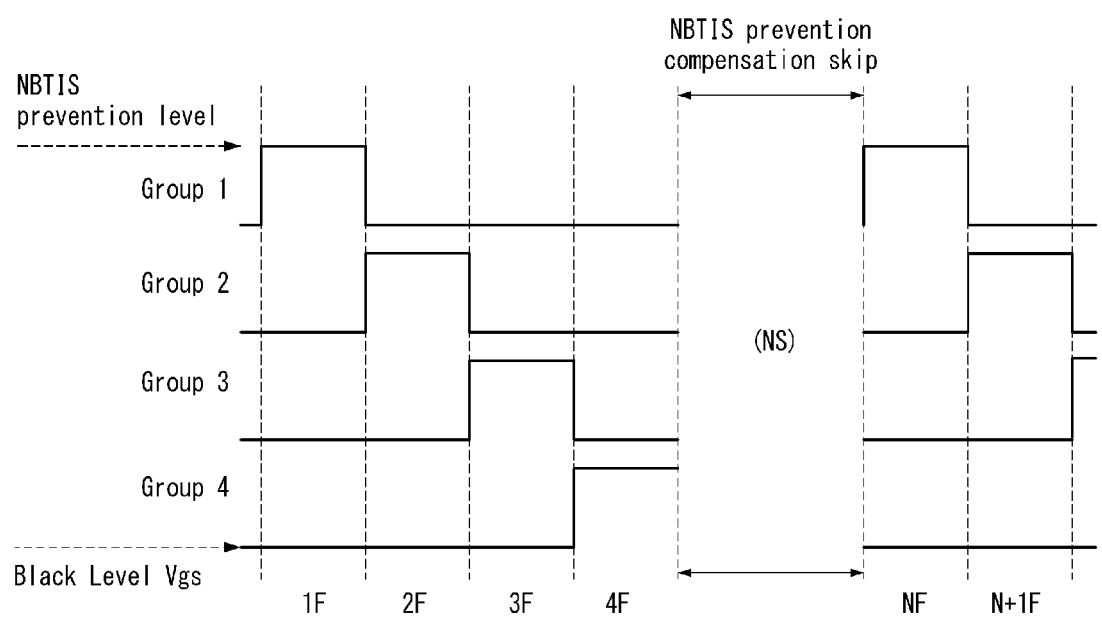
FIG. 18 illustrates waveforms for describing a method of applying a stress prevention voltage of a driving transistor according to the fourth embodiment of the present invention.

FIG. 17 is a block diagram of an external compensation circuit according to a fourth embodiment of the present invention and FIG. 18 illustrates waveforms for describing a method of applying a stress prevention voltage of a driving transistor according to the fourth embodiment of the present invention.

As shown in FIG. 17, the external compensation circuit according to the fourth embodiment is similar to the external compensation circuit shown in FIG. 6 except that the external compensation circuit according to the fourth embodiment further includes an image analyzer 123 and a signal modulator 126 in the timing controller 120.

The image analyzer 123 analyzes the data signal DATA input to the timing controller 120 and determines whether the stress prevention voltage will be applied. For example, the image analyzer 123 can skip output of the stress prevention signal when contrast ratio emphasis, HDR (High Dynamic Range), real black and high luminance or colors need to be realized on the display panel. To this end, the image analyzer 123 can analyze the data signal DATA input thereto using various image analysis techniques or filters.

The signal modulator 126 generates a stress compensation signal such that a stress compensation voltage is output from the data driver 140a and 140b according to one of the methods of the first, second and third embodiments. The signal modulator 126 modulates (varies) the stress compensation signal on the basis of the determination result of the image analyzer 123. The signal modulator 126 skips output of the stress prevention signal for I frames (I being an integer equal to or greater than 1) in response to analysis information delivered from the image analyzer 123.

As shown in FIGS. 17 and 18, when the signal modulator 126 skips output of the stress prevention signal, the data driver 140a and 140b also skips output of the stress prevention signal SPV for preventing and improving (reducing) NBTIS of the driving transistor DR.

Consequently, the stress prevention voltage (NBTIS prevention level) is output for the first to fourth frames 1F to 4F but is not output for specific frames after the first to fourth frames. That is, the stress prevention voltage (NBTIS prevention level) has a skip period NS (for skipping NBTIS prevention compensation) when contrast ratio emphasis, HDR, real black and high luminance or colors are realized. In addition, the stress prevention voltage (NBTIS prevention level) has a skip period NS (for skipping NBTIS prevention compensation) when real black is displayed or a dark image is displayed.

In the fourth embodiment, the stress prevention voltage is applied in microscopic units which control sub-pixels instead of macroscopic units which control the entire display panel, and thus it is possible to mitigate or improve flicker and black floating generated in the experimental example. In addition, according to the fourth embodiment, it is possible to improve display quality using adaptive modulation for outputting the stress prevention voltage or skipping output of the stress prevention voltage depending on images or driving environments.

As described above, the present invention can apply the stress prevention voltage in microscopic units which control sub-pixels instead of macroscopic units which control the entire display panel to mitigate or improve flicker and black floating, thereby improving display quality. In addition, the present invention can reduce a negative bias stress of driving transistors to solve problems due to NBTIS. Furthermore, the present invention can solve visibility problems with respect to the external compensation operation for externally compensating elements included in the display panel. Moreover, the present invention can secure a compensation margin of driving transistors during external compensation.

It will be apparent to those skilled in the art that various modifications and variations can be made in the OLED display device and the driving method thereof of the present disclosure without departing from the technical idea or scope of the disclosure. Thus, it is intended that the present disclosure cover the modifications and variations of this disclosure provided they come within the scope of the appended claims and their equivalents.

What is claimed is:

1. An OLED display device, comprising:
a display panel having sub-pixels for displaying images;
a data driver configured to supply a data signal to data lines of the sub-pixels; and
a timing controller configured to supply the data signal to the data driver and to control the data driver, wherein
the data driver outputs a stress prevention voltage for preventing application of stress to driving transistors included in the sub-pixels in response to a stress compensation signal output from the timing controller, wherein
the stress prevention voltage is applied to M (M being an integer equal to or greater than 1) sub-pixels selected per frame, and wherein
the stress prevention voltage has a skip period in which the stress prevention voltage is not output according to images, wherein
the skip period includes a period for implementing contrast ratio emphasis, HDR (High Dynamic Range), real black and high luminance or colors on the display panel.

2. The OLED display device according to claim 1, wherein the stress prevention voltage is applied to a driving transistor, included in at least one sub-pixel of first to N-th groups (N being an integer equal to or greater than 4) composed of sub-pixels, for each frame.

3. The OLED display device according to claim 2, wherein one of the first to N-th groups is selected in ascending order, descending order or random order, and the stress prevention voltage is applied to a driving transistor included in at least one sub-pixel of the selected group.

4. The OLED display device according to claim 1, wherein the stress prevention voltage is applied to a driving transistor included in one sub-pixel selected from a white sub-pixel, a red sub-pixel, a green sub-pixel and a blue sub-pixel.

5. The OLED display device according to claim 4, wherein the stress prevention voltage is applied to gate and source electrodes of the driving transistor included in the selected sub-pixel.

6. The OLED display device according to claim 1, wherein the timing controller comprises:
an image analyzer configured to determine whether the stress prevention voltage will be applied on the basis of a result of analysis of an input data signal; and
a signal modulator configured to generate and modulate the stress compensation signal and to skip output of the stress prevention voltage for I (I being an integer equal to or greater than 1) frame on the basis of a determination result of the image analyzer.

7. The OLED display device according to claim 1, wherein the stress prevention voltage is selected as a positive voltage for preventing a negative bias thermal illumination stress (NBTIS) of the driving transistors included in the sub-pixels.

8. The OLED display device according to claim 1, wherein the level of the stress prevention voltage is higher than the level of a black voltage applied to the display panel.

9. A method of driving an OLED display device, comprising:

supplying a black voltage to driving transistors included in all sub-pixels of a display panel; and outputting a stress prevention voltage for preventing a stress of the driving transistors included in the sub-pixels of the display panel, wherein the stress prevention voltage is applied to a driving transistor, included in at least one sub-pixel of first to N-th groups (N being an integer equal to or greater than 4) composed of sub-pixels, for each frame, and wherein the stress prevention voltage has a skip period in which the stress prevention voltage is not output according to images, wherein the skip period includes a period for implementing contrast ratio emphasis, HDR (High Dynamic Range), real black and high luminance or colors on the display panel.

10. The method of driving the OLED display device according to claim 9, wherein one of the first to N-th groups is selected in ascending order, descending order or random order, and the stress prevention voltage is applied to a driving transistor included in at least one sub-pixel of the selected group.

11. The method of driving the OLED display device according to claim 9, wherein the stress prevention voltage is applied to a driving transistor included in one sub-pixel selected from a white sub-pixel, a red sub-pixel, a green sub-pixel and a blue sub-pixel.

12. The method of driving the OLED display device according to claim 11, wherein the stress prevention voltage is applied to gate and source electrodes of the driving transistor included in the selected sub-pixel.

13. The method of driving the OLED display device according to claim 9, wherein the stress prevention voltage is selected as a positive voltage for preventing a negative bias thermal illumination stress (NBTIS) of the driving transistors included in the sub-pixels.

14. The method of driving the OLED display device according to claim 9, wherein the level of the stress prevention voltage is higher than the level of a black voltage applied to the display panel.

* * * * *